(12) United States Patent
Reed et al.

(10) Patent No.: US 8,788,988 B2
(45) Date of Patent: Jul. 22, 2014

(54) MANAGING CONSISTENCY OF MULTIPLE-SOURCE FABRICATION DATA IN AN ELECTRONIC DESIGN ENVIRONMENT

(75) Inventors: Jeffrey B. Reed, Austin, TX (US); Brian J. Nalle, Austin, TX (US); Michael A. Dukes, Wimberly, TX (US)

(73) Assignee: Apple Inc., Cupertino, CA (US)

( * ) Notice: Subject to any disclaimer, the term of this patent is extended or adjusted under 35 U.S.C. 154(b) by 189 days.

(21) Appl. No.: 13/285,718

(22) Filed: Oct. 31, 2011

(65) Prior Publication Data

US 2013/0111422 A1   May 2, 2013

(51) Int. Cl.
*G06F 17/50*   (2006.01)

(52) U.S. Cl.
USPC ............ 716/102; 716/110; 716/111; 716/136

(58) Field of Classification Search
USPC ......................................................... 716/102
See application file for complete search history.

(56) References Cited

U.S. PATENT DOCUMENTS

| | | | |
|---|---|---|---|
| 6,269,467 B1 | 7/2001 | Chang et al. | |
| 7,689,399 B1 * | 3/2010 | Hangal et al. | 703/14 |
| 7,861,203 B2 | 12/2010 | White et al. | |
| 7,962,886 B1 | 6/2011 | Pandey et al. | |
| 2005/0028113 A1 * | 2/2005 | Lin et al. | 716/3 |
| 2005/0050503 A1 * | 3/2005 | Keller et al. | 716/11 |
| 2008/0320550 A1 | 12/2008 | Strassner et al. | |
| 2009/0007042 A1 * | 1/2009 | Broberg et al. | 716/8 |

FOREIGN PATENT DOCUMENTS

JP    6110978    4/1994

OTHER PUBLICATIONS

Alberto Sangiovanni-Vincentelli, "The Tides of EDA," copublished by the IEEE CS and the IEEE CASS, Nov.-Dec. 2003, pp. 59-75.

* cited by examiner

*Primary Examiner* — Jack Chiang
*Assistant Examiner* — Eric Lee
(74) *Attorney, Agent, or Firm* — Meyertons, Hood, Kivlin, Kowert & Goetzel, P.C.

(57) ABSTRACT

Techniques and structures relating to consistency management for fabrication data are disclosed. A plurality of data sources may contain different values for a variety of design parameters usable by electronic circuit design tools to physically lay out at least a portion of an integrated circuit (such as minimum spacing rules, etc.). By seeking to detect different parameter values and/or parameter values that fail to meet a confidence threshold, potential errors may be uncovered at an earlier stage of the design process. Error detection may occur in response to a request to a database, or as part of a consistency check. Different file formats for different design tools may be imported into a central database to facilitate system operation, and an application programming interface may be used to acquire or calculate data values and perform checks in some embodiments.

21 Claims, 6 Drawing Sheets

Section 162A

| Design Parameter 172A | Value 174A | Confidence Value 176A |
|---|---|---|
| Min_Width | 70 (nm) | 5 |
| . . . | . . . | . . . |
| . . . | . . . | . . . |
| . . . | . . . | . . . |
| . . . | . . . | . . . |

(Hand-Generated)

Section 162B

| Design Parameter 172B | Value 174B | Confidence Value 176B |
|---|---|---|
| Min_Width | 65 (nm) | 55 |
| . . . | . . . | . . . |
| . . . | . . . | . . . |
| . . . | . . . | . . . |
| . . . | . . . | . . . |

(MILKYWAY)

Section 162C

| Design Parameter 172C | Value 174C | Confidence Value 176C |
|---|---|---|
| Min_Width | 65 (nm) | 45 |
| . . . | . . . | . . . |
| . . . | . . . | . . . |
| . . . | . . . | . . . |
| . . . | . . . | . . . |

(LEF)

MANAGING CONSISTENCY OF MULTIPLE-SOURCE FABRICATION DATA IN AN ELECTRONIC DESIGN ENVIRONMENT

BACKGROUND

1. Technical Field

This disclosure relates to electronic design automation (EDA), and more particularly, relates to techniques and structures allowing for management of multiple-source fabrication data in an EDA environment.

2. Description of the Related Art

In the electronic design industry, a project design flow at a given process node may include a variety of tools, either from a single electronic design automation (EDA) vendor, or from multiple EDA vendors. Each EDA tool in a design flow may rely on a special technology file that describes the process "recipe" for the level of abstraction that particular EDA tool operates at. Further, in-house tools and techniques may augment commercially available tools/flows with internally developed enhancement techniques. Accordingly, commercial design tools and internal procedures may use a variety of underlying technology ("tech") data in order to function properly.

Complications may arise during the development of a design project, however, as technology data used by an EDA tool may be in a preliminary (non-final) form at various stages of the project. In other stages of a project, technology data that is used by one or more EDA tools may simply be unavailable. In this case, "best guess" hand-generated data may be used in place of the missing data.

Accordingly, design and/or testing may have to take place without the availability of all the final, underlying EDA tool data. This approach can lead to difficulties, particularly as design and testing processes near their conclusions. For example, as a design project progresses, there may be no obvious indication that potentially unreliable hand-generated data was used at an earlier stage of the design project in place of other, unavailable EDA tool data. For example, hand-generated data that is stored in an application format, rather than a human-readable format, may be difficult for a developer to review or visually check. Thus, as time progresses, hand-generated data may be erroneously accepted as the "real" data. Another potential pitfall is that earlier, less accurate versions of EDA tool data may be used instead of more recent data versions (for example, due to tool data becoming available to developers in piecemeal fashion).

Incorrect tool data may cause discrepancies to be uncovered in the later steps of a design project, rather than earlier steps. Even worse, discrepancies may even go entirely undetected. Attempting to fix a discrepancy by reverse engineering an underlying tech file and/or design data can be a time-consuming process. Accordingly, providing such a fix may cause expensive delays or remedies—such as having to make one or more additional tape-outs for an integrated circuit that is being designed.

SUMMARY

Structures and techniques are described in this application that may allow for early detection of design errors in a dynamic, multiple-source electronic development environment. The current state of electronic design is complex, and may rely on a number of different tools to design different aspects of a chip—particularly with regard to the physical layout of features on that chip. By importing design parameter data to a central location, performing various processing, and assessing confidence values for that data, conflicting values for design parameters (such as width, spacing, etc.) can be detected in an organized fashion and at an earlier stage than they might otherwise have been found. This can provide an advantage, in some embodiments, over a hardware designer manually going through a number of files and attempting to locate discrepancies, for example.

The present techniques may be helpful in a multiple tool environment because these tools may have been developed by different companies, and thus use data files that are not compatible with one another. A first file, for example, may include a value named "MSW_1_1," while a second file includes a value named "MinimumSpaceWidthMetalOneLayerOne." Without centralization and/or translation of these values, however, the hardware developer may not realize they actually refer to the same thing. Further, some files may even use different measurement units than other types of files (and thus, standardization and conversion of measurements may be performed in the present disclosure).

Due to the complexity of modern hardware design, fixing design errors can be costly. Accordingly, in various embodiments, the present techniques may save both time and money, and lead to better development of electronic products. The teachings of this disclosure and the claims, however, are expressly not limited by the features, embodiments, and/or benefits discussed in the summary above.

DETAILED DESCRIPTION

This specification includes references to "one embodiment" or "an embodiment." The appearances of the phrases "in one embodiment" or "in an embodiment" do not necessarily refer to the same embodiment. Particular features, structures, or characteristics may be combined in any suitable manner consistent with this disclosure.

Terminology. The following paragraphs provide definitions and/or context for terms found in this disclosure (including the appended claims):

"Comprising." This term is open-ended. As used herein, this term does not foreclose additional structure or steps. Consider a claim that recites: "a system comprising a processor and a memory . . . ." Such a claim does not foreclose the system from including additional components (e.g., a graphics processing unit (GPU), a memory controller, interface circuitry, etc.).

"Configured To." Various units, circuits, or other components may be described or claimed as "configured to" perform a task or tasks. In such contexts, "configured to" is used to connote structure by indicating that the units/circuits/components include structure (e.g., circuitry) that performs those task or tasks during operation. As such, the unit/circuit/component can be said to be configured to perform the task even when the specified unit/circuit/component is not currently operational (e.g., is not on). The units/circuits/components used with the "configured to" language include hardware—for example, circuits, memory storing program instructions executable to implement the operation, etc. Reciting that a unit/circuit/component is "configured to" perform one or more tasks is expressly intended not to invoke 35 U.S.C. §112, sixth paragraph, for that unit/circuit/component. Additionally, "configured to" can include generic structure (e.g., generic circuitry) that is manipulated by software and/or firmware (e.g., an FPGA or a general-purpose processor executing software) to operate in manner that is capable of performing the task(s) at issue. "Configured to" may also include adapting a manufacturing process (e.g., a semiconductor fabrication facility) to fabricate devices (e.g., integrated circuits) that are adapted to implement or perform one or more tasks.

"First," "Second," etc. As used herein, these terms are used as labels for nouns that they precede, and do not imply any type of ordering (e.g., spatial, temporal, logical, etc.). For example, a "first" database section and a "second" database section can be used to refer to any two database sections, and does not imply that one database section was created before or after the other (for example). In other words, "first" and "second" are descriptors.

"Based On." As used herein, this term is used to describe one or more factors that affect a determination. This term does not foreclose additional factors that may affect a determination. That is, a determination may be solely based on those factors or based, at least in part, on those factors. Consider the phrase "determine A based on B." While B may be a factor that affects the determination of A, such a phrase does not foreclose the determination of A from also being based on C. In other instances, A may be determined based solely on B.

Figure 1:
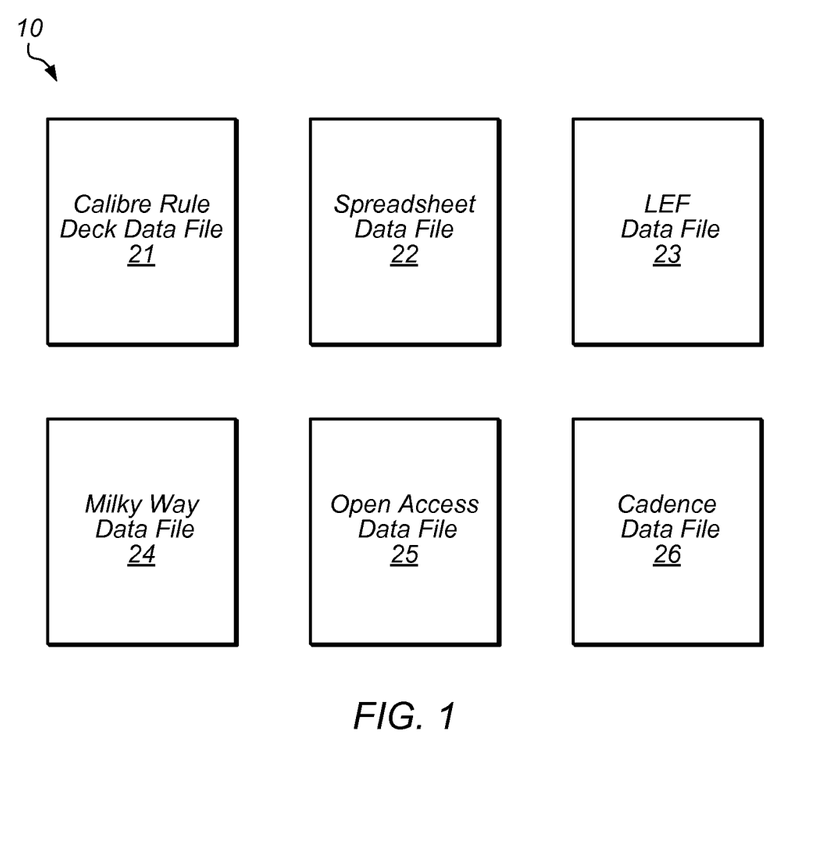
FIG. 1 is a block diagram showing an embodiment of several data files, one or more of which may be in the file format of an electronic circuit design tool.

Turning now to FIG. 1, a block diagram 10 is shown in which a variety of data files 21-26 are depicted. As depicted, data files 21-26 are in a format usable by one or more electronic circuit design tools, and may each contain one or more design parameter values for an integrated circuit. Note that although files 21-26 are shown as single digital files, one or more of files 21-26 may be split into multiple files in some embodiments. In yet other embodiments, content from two or more of files 21-26 may be combined into a lesser number of files (e.g., combined into a single file). Some of files 21-26 may not be present in some embodiments, while in other embodiments, additional files may be present.

In the embodiment of FIG. 1, file 21 is a CALIBRE™ rule deck data file. This file may contain layer definitions, GDSII mappings, connectivity definitions, device definitions, and Design Rule Checking (DRC) rules. File 22 is a spreadsheet data file, and in the embodiment depicted, 22 includes one or more pieces of hand-generated data as design parameter values. (This data may be entered from a process manual, for example.) File 23 is a Library Exchange Format (LEF) data file. In various embodiments, LEF file 23 may have a "tech" section that defines layer names, spacing rules, width rules, implied connectivity, via rules, antenna rules, and multicut via generation rules. In some embodiments, LEF file 23 does not provide information regarding GDSII layer numbers, devices, base layers, and other more complicated shape relations. In one embodiment, LEF file 23 also contains routing rules as well as definitions of various types of cell, blocks, rams, etc.

In the embodiment of FIG. 1, a SYNOPSYS MILKYWAY™ data file 24, an OPENACCESS™ data file 25, and a CADENCE™ data file 26 are also present. Accordingly, data file 24 may thus include topological, parasitic, and/or timing data, which may relate to physical synthesis, parasitic extraction, and/or physical verification. Data file 25 may include technology data containing the definitions of layers used in the design, definitions of VIAs and routing rules, and/or definitions of operating points used for analysis. Data file 26 may include schematic entry, behavioral modeling (e.g., Verilog-AMS), circuit simulation, custom layout, physical verification, and/or extraction and back-annotation data. Data file 26 may further include floorplanning, synthesis, test, and/or place and route data. In one embodiment, CADENCE data file 26 may include some or all of the same data as LEF file 23 (e.g., a CADENCE file may be a LEF file in some embodiments).

Figure 2:
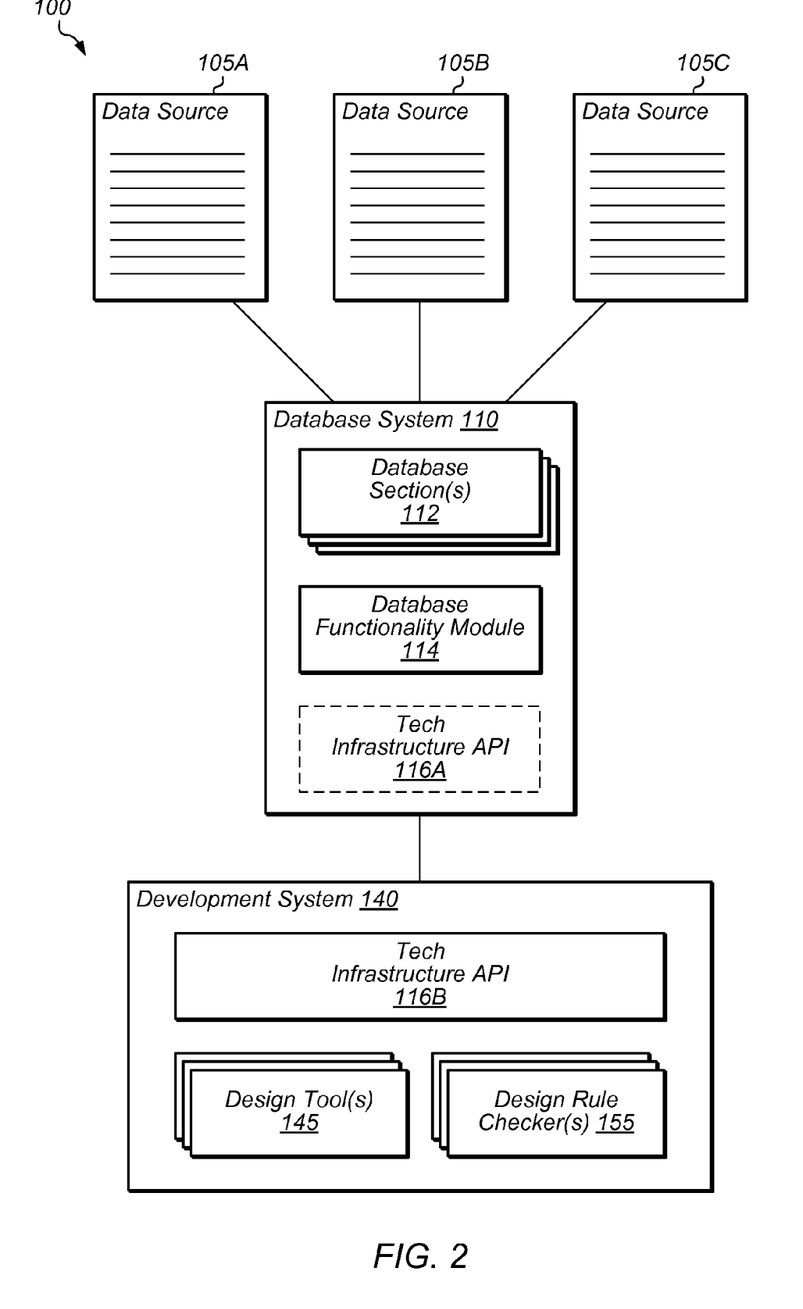
FIG. 2 is a block diagram of one embodiment of a system including data sources, a database system, and a development system.

Turning now to FIG. 2, a block diagram of one embodiment of a system 100 that includes data sources and systems is shown. In this embodiment, FIG. 2 includes data sources 105A-105C, database system 110, and a development system 140. Data sources 105 may be a vendor provided tech data file, a hand-generated tech data file (such as a spreadsheet), and/or any other digital data file that includes one or more values corresponding to physical layout data of an integrated circuit. For example, any of data files 21-26 (listed in FIG. 1) may be a data source 105 in the embodiment of FIG. 2.

Figure 7:
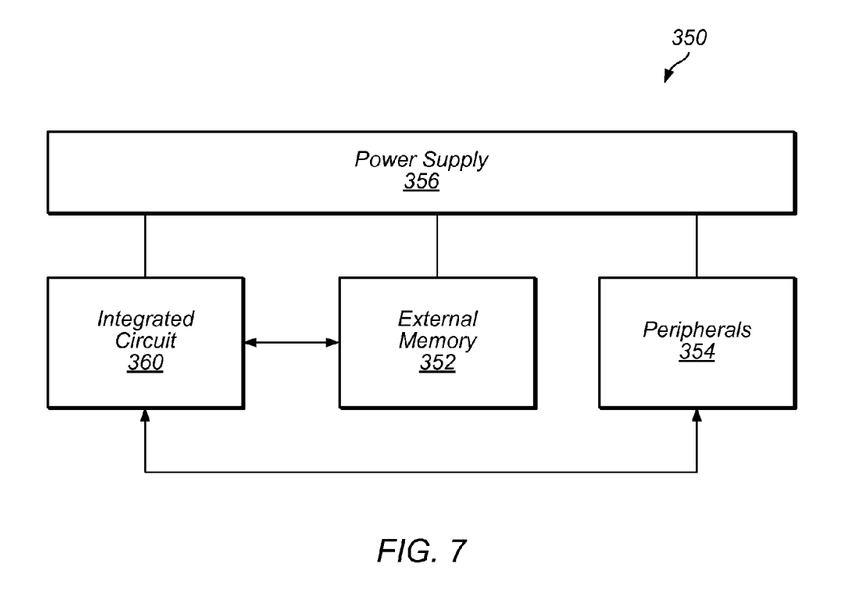
FIG. 7 is a block diagram of one embodiment of a system usable in accordance with the embodiment of FIG. 2.

Database system 110 and development system 140 may each be a computing device and/or computer system (e.g., system 350 as described with respect to FIG. 7). Accordingly, database system 110 and/or development system 140 may have one or more processors and one or more computer readable storage media configured to store data and executable instructions. As depicted, systems 110 and 140 are separate but connected systems (e.g., via a network connection). In some embodiments, however, systems 110 and 140 are combined as a single system. In general, any or all aspects of system 110 may be included within system 140 in various embodiments, and vice versa.

As shown, database system 110 includes one or more database sections 112 and a database functionality module 114. Section(s) 112 and module 114 may be data and/or executable code stored on one or more computer readable storage media in various embodiments. Each of database sections 112 specifies a type of physical layout data for an integrated circuit in the embodiment shown. The type of physical layout data may correspond, in some embodiments, to a type of physical layout data as described in one or more of data sources 105 (i.e., files 21-26). Accordingly, in one embodiment, two or more of sections 112 each respectively correspond to an electronic circuit design tool file format (CADENCE, etc.). Note that the term "electronic circuit design tool," as used herein, refers to software that is usable to specify one or more physical layout aspects (e.g., spacing, width) of an electronic circuit that is being designed. In another embodiment, each of data sources 105 directly corresponds to one or more of database sections 112. Thus in one embodiment, there are a same number of sections 112 and sources 105, and a given database section 112 may have the exact same data content (or a portion thereof) as a data source 105.

In one embodiment, database system 110 is a relational database system, and functionality module 114 includes SQL functionality that allows querying, modification of data, insertion or deletion of database sections, etc. In another embodiment, system 110 is a non-relational database system, and module 114 is correspondingly configured to provide data access to sections 112 via non-relational methods. In yet other embodiments, however, database system 110 may not be a formal relational or non-relational database at all. For example, database sections 112 may simply be plain files (text or binary) that have been imported to system 110 "as-is" (or with some processing) from data sources 105. In such a system, database functionality module 114 may not be present, or may simply be one or more text and/or binary editing tools suitable to access data stored in sections 112. As described below, API 116 may also facilitate access to database sections 112.

In the embodiment of FIG. 1, database sections 112 include, first and second sections that are respectively configured to store first and second values for a design parameter. This design parameter may specify a physical layout property of an integrated circuit. For example, a first section 112 might be configured to store a first value for a design parameter "Min_Width," which specifies the minimum acceptable feature size for a particular circuit layer. The value for Min_Width might be derived from a hand-generated value entered into a spreadsheet (at an early stage of the design process, for example). A second section 112 might also be configured to store a second value for the design parameter Min_Width, but this second value may instead be derived from an LEF data file (or another data source 105 and/or file 21-26, for example). The Min_Width design parameter may be used by one or more EDA tools in order to physically lay out one or more layers of an integrated circuit—for example, ensuring that an overly small feature size is not used, which could cause manufacturing difficulties at the foundry and/or cause improper function of the circuit.

Accordingly, database sections 112 may each include a number of data values that correspond to a number of design parameters that specify a physical layout properties of an integrated circuit. In the embodiment of FIG. 1, each design parameter may have one or more corresponding values in one or more different database sections. In other words, a design parameter value may be uniquely specified by a single database section, or a design parameter value may be specified by two or more different database sections. These values may also change over time. For example, at an early stage of the design process, only one value (or even no value at all) may be specified for a particular design parameter, while two or more values may be specified at a later time (e.g., after additional tech data files or information is received).

Accordingly, when imported into database section(s) 112, data sources 105 (and each piece of data therein) may be associated with a version number and/or date. This information may be particularly helpful in some embodiments when trying to trace back the source of an error. For example, a first MILKYWAY file may be labeled as version 1 and each design parameter data value in that file may be tagged with the version number and the date upon which the import occurred (e.g., the database may contain a tuple such as "Min_Width," "65 nm," "v1.0," "2011/09/26"). If the value is changed in a later file, another tuple may be inserted into the database (such as "Min_Width," "68 nm," "v2.0," "2011/10/05"). In some embodiments, the earlier (original) value for a parameter may be deleted, but in other embodiments it may be retained (e.g., for reference purposes). Also note that in some embodiments, a file or data source 105 may have its own internal versioning numbers, while in other embodiments, a version number may be assigned to the data source by system 110.

Database system 110 is configured, in the embodiment of FIG. 2, to import data in a variety of formats (e.g., such as the formats of files 21-26). One or more parsers (not depicted) may be configured to extract data in proprietary formats (e.g., MILKYWAY) as well as open standard or other formats (e.g., LEF). Plain text, binary, XML, and other formats may be used both for reading data from sources 105 and for storing data within database system 110.

As shown, database system 110 is configured to receive requests to a database. These requests may be processed or handled, at least in part, by database functionality module 114 and/or tech infrastructure API 116A. Requests to database system 110 may be for a design parameter that specifies a physical layout property of an integrated circuit. For example, a request for the "Min_Width" design parameter may be received by database system 110 in the embodiment of FIG. 2. Database system 110 is configured, in this embodiment, to generate a response for this request by performing a comparison involving first and second values for the requested design parameter. In one embodiment, system 110 simply compares two or more values to determine if they are the same (e.g., by checking a value from a first section 112 and a second value from a second section 112). If the two or more values are the same, then that value is included in a response that is generated and then returned to a requester. If the two values are not the same, an error or warning may be returned. As further described below, however, different algorithms may be used to process a request for a design parameter value in various embodiments.

Development system 140, as depicted, includes tech infrastructure application programming interface (API) 116B, one or more electronic circuit design tools 145, and one or more design rule checkers 155. These components may be implemented as executable code and/or data stored on one or more computer readable storage media.

API 116B may be used to communicate with database system 110 in the embodiment of FIG. 2. For example, API 116B may be used to formulate queries and/or requests to system 110, and may also receive responses. In the embodiment shown, API 116 is implemented on both system 110 and 140; that is, both system 110 and 140 include executable code related to the API. However, in other embodiments, API 116 may be present solely on database system 110, or present solely on development system 140.

Design tools 145 may include various tools such as those mentioned above—CALIBRE, MILKYWAY, etc. These design tools may use a variety of values from database sections 112 in order to specify physical properties of a circuit that is being designed. Design rule checkers 155 represent a variety of checks that may be run against design rules for a given circuit design. For example, a design rule may specify that the minimum spacing between features on an integrated circuit is 55 nm. Design rule checkers may be used to ensure that a design is not, in fact, in violation of a design rule. Design rules may be imported from various sources in the embodiment of FIG. 2, such as a CALIBRE rule deck file.

Confidence Values

In some embodiments, a response that is generated for a request to a database is based on confidence values for the design parameter that is requested. In the embodiment of FIG. 2, for example, any given design parameter value within database section(s) 112 may have a corresponding confidence value that has been assigned. These confidence values may be specified as relative numeric values (e.g., 5, 50, 100) and/or on a scale (e.g., 0=low confidence, 4=high confidence). The assignment of confidence values to particular design parameter values may be performed based on a variety of different schemes. In one embodiment, confidence value assignments are based on one or more rules stored within systems 110 and/or system 140 (e.g., as further described below).

Figure 3:
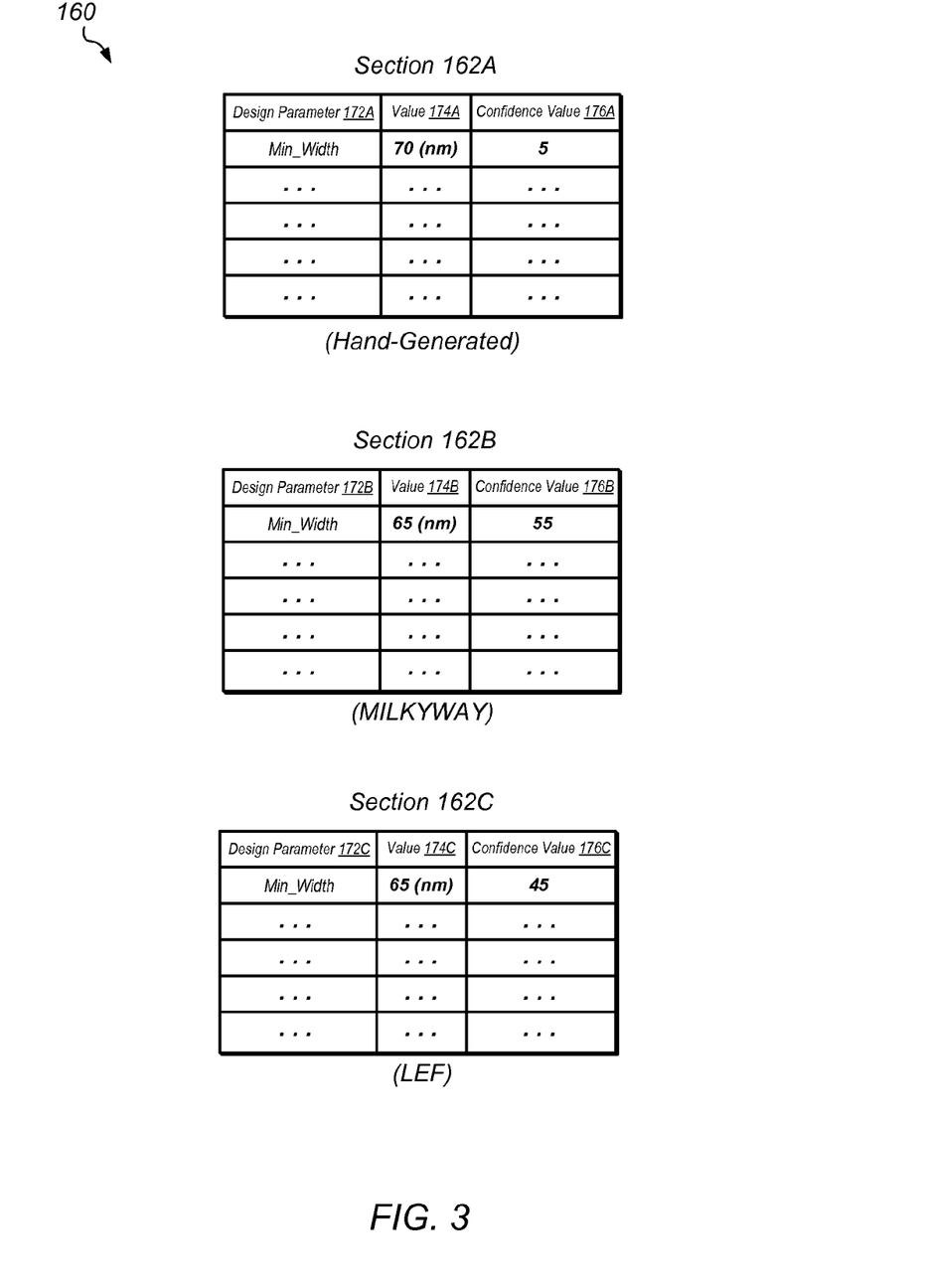
FIG. 3 is a block diagram illustrating an embodiment of one technique for assigning confidence values to design parameter values.

Turning to FIG. 3, a block diagram 160 is shown illustrating an embodiment of database sections 112 in which confidence values are assigned. In this embodiment, three database sections are present (162A, 162B, and 162C). Database section 162A corresponds to values imported from a hand-generated data file. Database section 162B corresponds to values originating in a MILKYWAY file, while database section 162C corresponds to values originating in a LEF file.

In the embodiment of FIG. 3, a simple scheme is used to assign confidence values. All hand-generated values (in section 162A) will receive a relative confidence value of "5", while all MILKYWAY and LEF values are respectively given confidence values of "55" and "45". In other embodiments, however, different rules may be used to assign confidence values.

For example, a single database section may have different confidence values for different database parameter values (that is, all confidence values within a database section need not be identical). Confidence values may be based on a date or version of the underlying data or file from which a corresponding design parameter value is taken. For example, if a data source 105 has a particular version number associated with it, a date value from that earlier version may be given a lower confidence value than a later version of the same data source. Confidence values may be increased automatically in some embodiments when a later version includes a different value for a given design parameter. For example, if a version 1.0 file includes a value of "65 nm" for "Min_Width", and a version 2.0 file includes the different value of "63 nm", it might be assumed that by virtue of the fact that the later file version has been completed and that the Min_Width value has been changed, the newer, different value should be more reliable. Accordingly, in one embodiment, a later versioned (or later dated) data source 105 that contains a different parameter value will be given a higher confidence value than that parameter value previously had. (For example, the confidence value might be moved up by a threshold amount, such as "5", or as a percentage of the previous value, such as 10%). While specific confidence values may be assigned to some parameters, default confidence values may also be used for other parameters in various embodiments. Confidence values may be assigned via API 116 in some embodiments.

As noted above, in some embodiments, the form and/or content of a response to a database request for a design parameter may be based on confidence values. In one embodiment, the response will include a numeric value along with an indication of the confidence value(s). The numeric value may be an average (either weighted or non-weighted) of values in one or more sections of a database. For example, in FIG. 3, a query for "Min_Width" might return a non-weighted average of 66.67 nm (the average of 70 nm, 65 nm, and 65 nm). Another query might also return a weighted average of:

$$65.23 \text{ nm} = (70 \text{ nm}*5/110) + (65 \text{ nm}*55/110) + (65 \text{ nm}*45/110)$$

In this example, the numerators 5, 55, and 45 respectively correspond to the confidence values listed in columns 176A, 176B, and 176C, while the denominator 110 is the total of all those confidence values. Numerators 70, 65, and 65 correspond to the values in columns 174A, 174B, and 174C. The above weighted-average formula can be generalized and used with lesser or greater numbers of parameter values and confidence values in order to make other weighted average calculations. Also note that while averages have been given to two decimal places in the examples above, greater or lesser precision may be used in some embodiments. Accordingly, confidence values may be used to determine a response to a query for a design parameter that specifies a physical layout property of an IC.

Confidence values may also be used with respect to a confidence threshold when generating a response. For example, the threshold value of "90" might be set as a desirable confidence level to have for a particular design parameter. In the embodiment of FIG. 3, merely using the value from 176B or 176C would not satisfy such a threshold. In this case, a response might return "65 nm" (ignoring 176A for now), but also include a warning or indication that the confidence threshold has not been met. If both values from 176B and 176C were used, however, the total confidence value would be 100 (45+55), which is greater than the threshold of 90 in this example. In this latter case, then, no confidence warning would be created in the embodiment of FIG. 3.

Responses to database queries or requests may include indications of a design error condition in some embodiments (though design error conditions are not limited only to responses, as further discussed). A design error condition may be determined in some embodiments by comparing first and second values for a particular design parameter. If two or more values are sufficiently far apart, for example, it may be desirable to create an alert to this condition that a developer will be able to see.

In determining whether a design error condition exists, the difference between two or more values may be compared with respect to a threshold value (or percentage), for example. Consider sections 162A-162C as depicted in FIG. 3. A threshold value of 10% might be used as one determinant of whether a design error condition exists—that is, if any two values for a given design parameter are greater than 10% apart, an alert will be generated. In FIG. 3, the value in column 174A is not greater than 10% from the identical values in columns 174B and 174C—accordingly, no error condition would exist in this example. However, if the error threshold condition was lowered to 5% (or to an absolute value of 4 nm), then a design error condition alert would be generated. A design error condition may be included in a response to a database query or request, and may include detailed information about what type of violation has occurred, as well as numeric values relating to that violation. These error conditions may be in addition to and/or separate from rules checked by design rule checkers 155.

Figure 4:
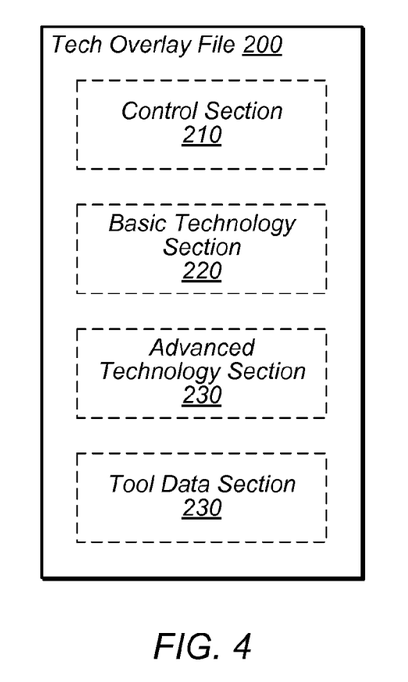
FIG. 4 is a block diagram showing one embodiment of a tech overlay file.

Turning now to FIG. 4, one embodiment of a tech overlay file 200 is shown. In this embodiment, tech overlay file 200 includes a control section 210, a basic technology section 220, an advanced technology section 230, and a tool data section 240. Tech overlay file 200 may exist on database system 110, development system 140, or both, in various embodiments. An initializer and a checker may be associated with tech overlay file, and may be executed via API 116 in some embodiments.

In one embodiment, tech overlay file 200 is implemented as an ASCII file, and includes a centralized repository of information from (or calculated from) database section(s) 112. For example, tech overlay file 200 may contain calculated values for all available design parameters (which may or may not be the same as individual values stored within various sections of database 112). Accordingly, in one embodiment, tech overlay file 200 includes pre-computed responses for various database requests and/or queries. Overlay file 200 may be created from files 21, data sources 105, and/or information in database section(s) 112 in various embodiments.

Control section 210 includes, in the embodiment of FIG. 4, technology availability, naming, sources, age of sources, defaults, units, confidence grading, layer mapping, and confidence level function specifications. In this embodiment, basic technology section 220 includes layer types, direction, order, connectivity information (above, below, text), and first order width and spacing information. As shown, advanced technology section includes design rule checking (DRC) rule values based on complicated shape interactions, DRC rule values that may vary by shape size, and rules for constructing devices from polygons (LVS extraction). In various embodiments, tech overlay file 200 may have the any or all of the following features:

No Order Dependence;
Any class of Layer;
Support for Generic Rules;
Support Multi-Connect;
Support Rule Tables (e.g., width vs. space);
Source to tech (from LEF/MW/Calibre/Cadence tech/OA); and
Handle more than eight layers of metal.

The checker and/or initializer for the tech overlay file 200 may, in various embodiments, check syntax by running a routine to convert hand-edited ASCII overlay to a binary overlay format. If no errors are generated then a subsequent step may be to run the tool (e.g., MILKYWAY) requiring an update to the data in the tech overlay to see that the new value presents itself properly. (Thus, the tech overlay file 200 may be a central repository for all tools 145 used by a development system 110). One or more checkers may scan through the various tech infrastructure files (e.g., 21-26) for syntax errors, invalid data relationships, and completeness in the embodiment of FIG. 4. Tech infrastructure files may also be checked for adherence to original sources.

A variety of functions in API 116 may provide access into tech overlay file 200 in the embodiment of FIG. 4. These functions may allow, for example, the following information to be added, updated, accessed, or deleted:

Database UNITS and Conversions;
Spacing, Overlap, and Width;
Global Net Names;
Named Props That Have A Simple Value;
LAYERS—Naming, Numbers, Gds2, and Texting;
Via Information;
Parasitic Property Access;
EM Information;
New DRC Format Rule Access;
Technology Process Name;
Specific Layer Values;
Transistor Related Values; and
Tie Related Values.

Note that API access to overlay file 200 is not limited to the above, however. Further note that tech overlay file 200 may standardize units across different types of files (for example, if one source uses 1 nm units, and another source uses 10 nm units, conversion can be applied via arithmetic operations).

Figure 5:
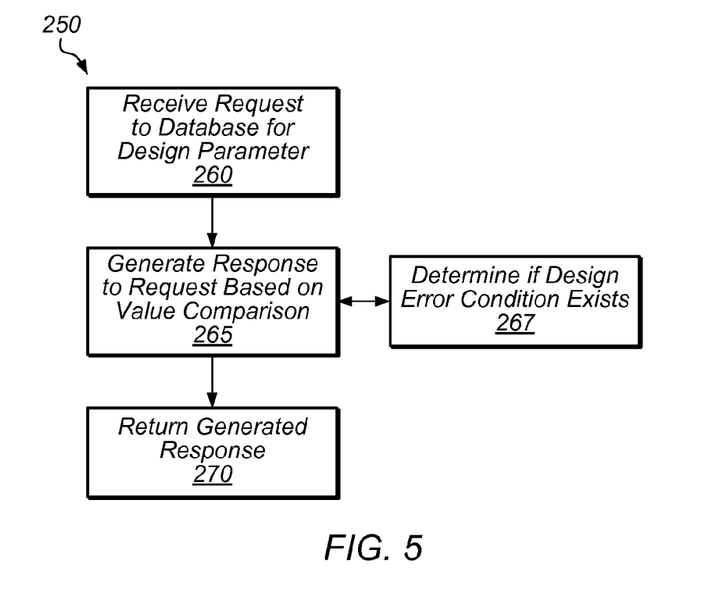
FIG. 5 is a flow chart of one embodiment of a method in which a design parameter request is received.

Turning now to FIG. 5, a flow chart of one embodiment of a method 250 in accordance with the present disclosure is shown. In various embodiments of method 250 described below, one or more of the elements and/or steps described may be performed concurrently, in a different order than shown, or may be omitted entirely. Other additional elements may also be performed as desired. All or a portion of steps of method 250 may be performed by database system 110 and/or development system 140 in various embodiments, and should be understood in view of the disclosure discussed above relative to FIG. 2.

In step 260, a request to a database for a design parameter that specifies a physical layout property of an integrated circuit is received. As noted above, the database may have a plurality of sections, each of which specifies a type of physical layout data. Further, the database may include first and second sections that are configured to respectively store first and second values for that design parameter. In step 265, a response to the request is generated. The response is generated, in one embodiment, based on a comparison involving the first and second values, but may be based in any manner discussed above with respect to FIG. 2 in various embodiments. Step 267 determines if a design error condition exists, and may be performed prior to, subsequent to, or concurrently with step 265 in some embodiments. In another embodiment, however, step 267 is optional and/or is not performed. Finally, as depicted, step 270 returns the generated response. This response may include a value for the design parameter, an indication of whether an error condition exists, confidence value data, and/or any other appropriate information (e.g., as may have been described above).

Further embodiments of method 250 may have additional steps and/or features. In one embodiment, generating a response to a database request is based on first and second confidence values that respectively correspond to first and second values for a design parameter. In another embodiment, step 267 includes determining, from a comparison involving the first and second values, that a design error condition exists with respect to the physical layout property of the integrated circuit, and the response that is returned includes an indication of the design error condition. Receiving the request to the database and returning the response may also be performed via an application programming interface configured to interact with the database in one embodiment. (For example, API 116 may specify one or more particular function definitions and/or data exchange formats via which requests and responses can be communicated).

Figure 6:
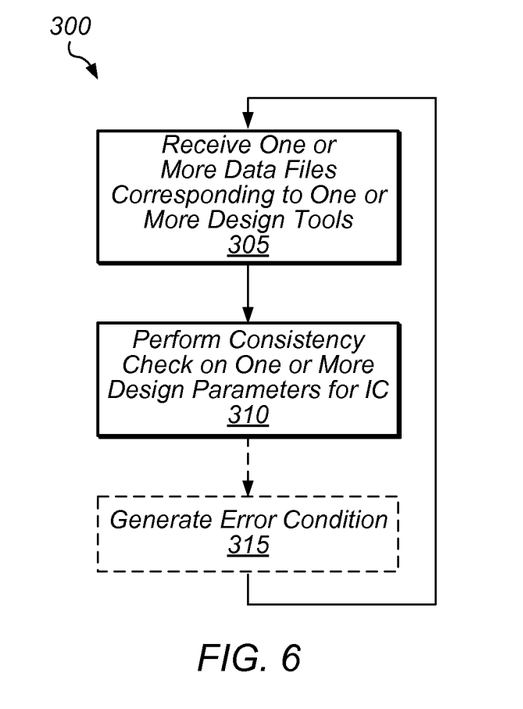
FIG. 6 is a flow chart of one embodiment of another method in which a consistency check is performed based on contents of one or more data files having design parameter values.

Turning now to FIG. 6, a flow chart of another embodiment of a method 300 in accordance with the present disclosure is shown. In various embodiments of method 300 described below, one or more of the elements and/or steps described may be performed concurrently, in a different order than shown, or may be omitted entirely. Other additional elements may also be performed as desired. All or a portion of steps of method 300 may be performed by database system 110 and/or development system 140 in various embodiments, and should be understood in view of the disclosure discussed above relative to FIG. 2.

In step 305, a computer system receives one or more files containing a plurality of data values for a plurality of design parameters usable by a plurality of electronic circuit design tools to physically lay out at least a portion of an integrated circuit. For example, the computer system may receive a MILKYWAY file, LEF file, and another file with hand-generated data.

In step 310, the computer system performs a consistency check on the plurality of design parameters, where performing the consistency check includes analyzing the plurality of files to determine if, for each of the plurality of design parameters, two or more different values for that design parameter are specified in the plurality of data values. For example, the contents of a MILKYWAY file, LEF file, and file with hand-generated data may each be examined for a particular design parameter (such as Min_Width for a particular metal and/or layer; also note that generally, all design parameter values may be specific to a particular metal and/or layer, and may be queried as such via API 116). If all values specified in the three files are identical, the consistency check will be passed in this example. In one embodiment, the consistency check will be passed even if one or more values for the design parameter are missing (e.g., the LEF file and hand-generated data file contain the same "60 nm" value, but no value is specified by the MILKYWAY file). In another embodiment, however, one or more rules may indicate that a missing value from one or more files should cause the consistency check to fail. Such rules may be customized for different designs, data versions, and/or particular design parameters. For example, a rule might specify that for one particular parameter, if only a MILKYWAY file and CADENCE file are present, then it is OK if that parameter has no specified value in one of those two files. However, the same rule might also dictate that if a CALIBRE file is also present, both the CALIBRE file and at least one of the MILKYWAY and CADENCE file must have matching values. Other variations are possible.

Exact matching values are not necessary, in some embodiments, for a consistency check to be passed. For example, certain acceptable threshold values and/or percentages for differences between values may be specified for any number of design parameters. Continuing the above example, the design parameter "Min_Width" might pass the consistency check if two values are within the greater of 6 nm or 5% of the difference between the values. Also, different consistency rules may be employed at different stages of the design process. For example, once a CALIBRE file (or other file considered to have more generally accurate information) becomes available, an error tolerance for a design parameter value may be reduced. So, the design parameter "Min_Width" might only pass the consistency check if two values are within the greater of 3 nm or 2% in the event that a CALIBRE file is present. Further, in some embodiments, certain types of data sources may "trump" other data sources for some or all design parameter values. For example, in one embodiment, if a design parameter value relates to routing, LEF values may be used to the exclusion of all other values from other database sections (e.g., values from other sources). This process could be accomplished, in one embodiment, by assigning LEF data sources a relative confidence value of 1, and assigning other sources a relative confidence value of 0. In various embodiments, rules and conditions can be customized for each design parameter, groups of design parameters, types of design parameters, etc., based on any of the aforementioned data available to database system 110. For example, some parameter values from a source may have different confidence values than other values from that same source (e.g., between different metal groups, layers, etc.). Rules for consistency and value determination may also be stored on one or more computer readable media.

Accordingly, in step 315, an indication of a design error condition may optionally be generated in response to the determination that one or more design parameters has two or more different specified values. Such a design error condition may be indicated in a response that is generated during the consistency check, and/or may be part of a general report that is delivered after a consistency check is finished. For example, a consistency check may generate a report, in one embodiment, that informs a developer of all perceived consistency problems within a design database at the time the check is run. These problems may cover a number of different areas and types of data. The relative severity of a design error condition may also be indicated—for example, providing warnings and/or errors of different severity levels (e.g., "warning," "minor error," "critical error," etc.) In accordance with the above, design error conditions may be reported as part of a consistency check and/or as a response to a database request or query.

In another embodiment, the consistency check performed in step 310 is based on a plurality of confidence levels assigned to two or more values for at least a first one of a plurality of design parameters. For example, as discussed above and relative to FIG. 3, a determination may be made as to whether design parameter values are sufficiently close together that they should be deemed acceptable. In one embodiment, relative confidence values may also be summed to determine if the specified values achieve a required confidence threshold. If a confidence threshold of 90 is required, for example, a consistency check on the "Min_Width" parameter might fail if the only two parameter values available have consistencies of 35 and 40 (or 75 total). In this case, a warning might be generated indicating that the parameter may not be sufficiently reliable at this stage of the design. Later, if another data source is received that has a matching value pushing the total consistency to 90 or above, the design parameter might be deemed to pass the consistency check. (Note again that in some embodiments, and under some rules, identical parameter values may be required, but in other embodiments and under other rules, some variation within a defined range or percentage might be accepted.) Accordingly, in one embodiment, an additional data parameter value that boosts a total confidence level over a threshold may still allow the consistency check to pass even if the new value is not identical to other previously received values.

Method 300 may be repeated, in the embodiment of FIG. 6, in the event that an additional (or updated) data file containing one or more design parameter data values is received. For example, a first consistency check might be performed based only on a MILKYWAY file and a hand-generated data file. However, when an additional data file (such as a CALIBRE file) is received, an additional consistency check might be performed on at least one of the plurality of design parameters. Such an additional consistency check may compare an updated value for at least one design parameter to a value for the at least one design parameter that is from another (earlier) data file. In the example above, the CALIBRE file value might be compared with values from the MILKYWAY and/or hand-generated data file to determine if a design parameter passes an (additional) consistency check.

In one embodiment, method 300 also includes the steps (not depicted) of receiving a query for a value for a first one of a plurality of design parameters, determining that value from one or more of the plurality of files, and returning a response to the query, where the response includes the determined value. Queries, for example, can be responded to much in the same way as requests are responded to in the embodiment of FIG. 2. In one embodiment, a query is a structured SQL query, while in another embodiment, the query is performed through API 116 and is not necessarily an SQL query.

Exemplary Computer System

Turning next to FIG. 7 a block diagram of one embodiment of a system 350 is shown. System 350 may be used in various embodiments to implement all or a portion of database system 110 and/or development system 140. In the illustrated embodiment, system 350 includes at least one instance of an integrated circuit (processor) 360 coupled to an external memory 352. The external memory 352 may form a main memory subsystem in one embodiment. The integrated circuit 360 is coupled to one or more peripherals 354 and the external memory 352. A power supply 356 is also provided which supplies one or more supply voltages to the integrated circuit 360 as well as one or more supply voltages to the memory 352 and/or the peripherals 354. In some embodiments, more than one instance of the integrated circuit 360 may be included (and more than one external memory 352 may be included as well).

The memory 352 may be any type of memory, such as dynamic random access memory (DRAM), synchronous DRAM (SDRAM), double data rate (DDR, DDR2, DDR3, etc.) SDRAM (including mobile versions of the SDRAMs such as mDDR3, etc., and/or low power versions of the SDRAMs such as LPDDR2, etc.), RAMBUS DRAM (RDRAM), static RAM (SRAM), etc. One or more memory devices may be coupled onto a circuit board to form memory modules such as single inline memory modules (SIMMs), dual inline memory modules (DIMMs), etc. Alternatively, the devices may be mounted with an integrated circuit 360 in a chip-on-chip configuration, a package-on-package configuration, or a multi-chip module configuration.

The peripherals 354 may include any desired circuitry, depending on the type of system 350. For example, in one embodiment, the system 350 may be a mobile device (e.g. personal digital assistant (PDA), smart phone, etc.) and the peripherals 354 may include devices for various types of wireless communication, such as wifi, Bluetooth, cellular, global positioning system, etc. The peripherals 354 may also include additional storage, including RAM storage, solid state storage, or disk storage. The peripherals 354 may include user interface devices such as a display screen, including touch display screens or multitouch display screens, keyboard or other input devices, microphones, speakers, etc. In other embodiments, the system 350 may be any type of computing system (e.g. desktop personal computer, server, laptop, workstation, net top etc.). Peripherals 354 may thus include any networking or communication devices necessary to interface two computer systems (such as in the embodiment of FIG. 1, in which systems 110 and 140 are connected).

Computer Readable Medium

Figure 8:
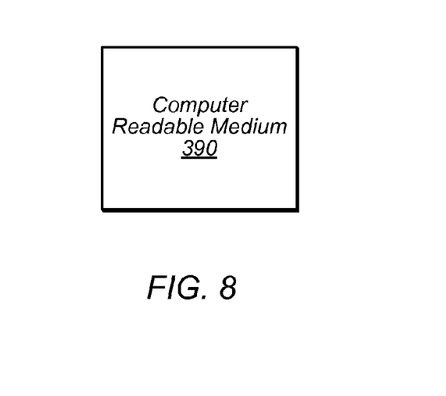
FIG. 8 depicts one embodiment of a computer readable storage medium.

The above-described techniques and methods may be implemented as computer-readable instructions stored on any suitable computer-readable storage medium, such as medium 390 depicted in FIG. 8. As used herein, the term computer-readable storage medium refers to a (nontransitory, tangible) medium that is readable by a computer or computer system, and includes magnetic, optical, and solid-state storage media such as hard drives, optical disks, DVDs, volatile or nonvolatile RAM devices, holographic storage, programmable memory, etc. The term "non-transitory" as applied to computer readable media herein is only intended to exclude from claim scope any subject matter that is deemed to be ineligible under 35 U.S.C. §101, such as transitory (intangible) media (e.g., carrier waves), and is not intended to exclude any subject matter otherwise considered to be statutory. Computer-readable storage mediums such as medium 390 can be used, in various embodiments, to store instructions and/or data that comprise data sources 105, database sections 112, database functionality module 114, tech infrastructure API 116, design tools 145, design rule checkers 155, and/or tech overlay file 200.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure. Additionally, section or heading titles provided above in the detailed description should not be construed as limiting the disclosure in any way.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. A method, comprising:
a computer system storing, in a database, first and second values for a design parameter that specifies a physical layout property of an integrated circuit, wherein the first and second values are respectively based on first and second parameter settings for first and second different electronic circuit design tools;
receiving a request to the database for the design parameter, wherein the database includes a plurality of sections, each of which specifies a type of physical layout data, and wherein the plurality of sections include first and second sections that respectively store the first and second values for the design parameter;
the computer system generating a response to the request based on a combination of the first and second values for the design parameter, wherein the generating includes calculating a total confidence value for the design parameter that is based on first and second confidence values that respectively correspond to the first and second values for the design parameter; and
the computer system returning the response to the request, wherein the response indicates, based on whether the total confidence value exceeds a confidence threshold value, whether an error condition exists for the design parameter.

2. The method of claim 1, further comprising:
the computer system determining, from a comparison involving the first and second values, that a design error condition exists with respect to the physical layout property of the integrated circuit; and
wherein the response includes an indication of the design error condition.

3. The method of claim 1, wherein the combination of the first and second values for the design parameter is based on an average of the first and second design values.

4. The method of claim 1, further comprising the computer system receiving the request and returning the response to the request via an application programming interface configured to interact with the database.

5. A non-transitory computer readable storage medium having instructions stored thereon that, if executed by a computer system, cause the computer system to perform operations comprising:
receiving a query for a design parameter, wherein the design parameter specifies a physical layout property of an integrated circuit;
accessing a database that includes a plurality of sections, each of which corresponds to a respective electronic circuit design tool configured to use one or more types of physical layout data, and wherein the plurality of sections of the database include first and second sections respectively configured to store first and second values for the design parameter that are based on different data sources; and generating a response to the query based on a combination of the first and second values for the design parameter, wherein generating the response includes calculating a total confidence value for the design parameter that is based on first and second confidence values that respectively correspond to the first and second values for the design parameter, and wherein the response indicates, based on whether the total confidence value exceeds a confidence threshold value, whether an error condition exists for the design parameter.

6. The non-transitory computer readable storage medium of claim 5, wherein the operations further comprise performing a consistency check on the database by comparing a plurality of values for a plurality of design parameters of the integrated circuit, wherein each of the plurality of design parameters corresponds to one or more physical layout properties of the integrated circuit.

7. The non-transitory computer readable storage medium of claim 6, wherein the operations further comprise generating and reporting a warning in response to determining that one or more of the plurality of design parameters of the integrated circuit has failed the consistency check.

8. The non-transitory computer readable storage medium of claim 5, wherein the operations further comprise constructing the database by automatically importing a plurality of files in formats of the electronic circuit design tools.

9. The non-transitory computer readable storage medium of claim 5, wherein the operations further comprise receiving the query for the design parameter via an application programming interface.

10. A system, comprising:
a processor; and
a memory coupled to the processor and having stored thereon instructions executable by the processor to cause the system to perform operations comprising:
storing, in a database, first and second values for a design parameter that specifies a physical layout property of an integrated circuit, wherein the first and second values are respectively based on first and second parameter settings for first and second different electronic circuit design tools
receiving a request to the database, wherein the request is for the design parameter, wherein the database includes a plurality of sections, each of which specifies a type of physical layout data, and wherein the plurality of sections include first and second sections that respectively store the first and second values for the design parameter;
generating a response to the request, wherein the generating is based on a combination of the first and second values, wherein the combination of the first and second values is calculated from a weighted average based on first and second confidence values that respectively correspond to the first and second values for the design parameter; and
returning the response to the request.

11. The system of claim 10, wherein the operations further comprise: determining, from a comparison involving the first and second values, that a design error condition exists with respect to the physical layout property of the integrated circuit; wherein the response includes an indication of the design error condition.

12. The system of claim 10, wherein two or more of the plurality of database sections each respectively correspond to an automated circuit design tool file format.

13. The system of claim 10, wherein the operations further comprise receiving the request and returning the response to the request via an application programming interface configured to interact with the database.

14. A method, comprising:
a computer system receiving a plurality of files containing a plurality of data values for a plurality of design parameters usable by a plurality of electronic circuit design tools physically lay out at least a portion of an integrated circuit; and
the computer system performing a consistency check on the plurality of design parameters, wherein performing the consistency check includes:
calculating a total confidence value for at least one of the plurality of design parameters, wherein the total confidence value is based on first and second confidence values that respectively correspond to the first and second values for the at least one design parameter; and
wherein a result of the consistency check indicates, based on a comparison of the total confidence value to a confidence threshold value, whether an error condition exists for the at least one design parameter.

15. The method of claim 14, wherein the consistency check is based on a plurality of confidence levels that are assigned to two or more values for at least the first one of the plurality of design parameters.

16. The method of claim 14, further comprising:
receiving an additional data file containing one or more data values for the plurality of design parameters;
performing an additional consistency check on at least one of the plurality of design parameters, wherein performing the additional consistency check includes comparing an updated value for the at least one design parameter from the additional data file to a value for the at least one design parameter from one of the plurality of data files.

17. The method of claim 14, further comprising:
receiving a query for a value for a first one of the plurality of design parameters;
determining the value for the first design parameter from one or more of the plurality of files; and
returning a response to the query, wherein the response includes the determined value.

18. A non-transitory computer readable storage medium having instructions stored thereon that, if executed by a computer system, cause the computer system to perform operations comprising:
importing first and second sets of one or more design parameter values into first and second respective sections of a database, wherein the first and second sets correspond to different data sources, wherein the one or more design parameter values correspond to one or more geometric properties of at least a first metal in a layer of an integrated circuit; and
in response to the importing, performing a consistency check on the one or more design parameter values, wherein performing the consistency check includes:
calculating a total confidence value for a first one of the one or more design parameters that is based on a first confidence value corresponding to the value in the first set and a second confidence value corresponding to the value in the second set; and comparing the total confidence value to a confidence threshold value for the first one of the one or more design parameters.

19. The non-transitory computer readable storage medium of claim 18, wherein the one or more geometric properties include a minimum width for the at least a first metal.

20. The non-transitory computer readable storage medium of claim 18, wherein the operations comprise:
   accessing the database to determine one or more design rules; and
   checking the one or more design rules against values in the first and second sections of the database.

21. The non-transitory computer readable storage medium of claim 18, wherein the operations comprise performing the consistency check in response to receiving a query for the one or more design parameter values; and
   wherein the operations further comprise returning a response to the query, wherein the response includes a determined value for the one or more design parameter values.

* * * * *